United States Patent
Rostron et al.

(10) Patent No.: US 7,191,074 B2
(45) Date of Patent: Mar. 13, 2007

(54) ELECTRIC POWER MONITORING AND RESPONSE SYSTEM

(75) Inventors: Joseph R. Rostron, McDonough, GA (US); Raj Anand, McDonough, GA (US); Lyle Thomas Keister, Bishop, GA (US)

(73) Assignee: SSI Power, LLC, Hampton, GA (US)

( * ) Notice: Subject to any disclaimer, the term of this patent is extended or adjusted under 35 U.S.C. 154(b) by 0 days.

(21) Appl. No.: 11/132,762

(22) Filed: May 18, 2005

(65) Prior Publication Data

US 2005/0286190 A1 Dec. 29, 2005

Related U.S. Application Data

(60) Provisional application No. 60/583,907, filed on Jun. 29, 2004.

(51) Int. Cl.
*G06F 19/00* (2006.01)
*G01R 21/00* (2006.01)

(52) U.S. Cl. .............................. 702/60; 702/58; 702/65; 361/65

(58) Field of Classification Search ................ 702/57, 702/58, 60, 62, 64, 65, 186, 188; 324/96, 324/126, 127; 361/65
See application file for complete search history.

(56) References Cited

U.S. PATENT DOCUMENTS

| 4,228,475 A | * | 10/1980 | Sherwood ..................... 361/47 |
|---|---|---|---|
| 5,151,649 A | | 9/1992 | Heroux |
| 5,250,894 A | | 10/1993 | Bridges |
| 5,325,315 A | * | 6/1994 | Engel et al. ................. 702/105 |
| 6,397,155 B1 | * | 5/2002 | Przydatek et al. ............ 702/61 |
| 2002/0180459 A1 | | 12/2002 | Skendzic et al. |
| 2003/0014200 A1 | * | 1/2003 | Jonker et al. ................. 702/60 |

FOREIGN PATENT DOCUMENTS

WO   WO 9627802 A2   9/1996

\* cited by examiner

*Primary Examiner*—Bryan Bui
(74) *Attorney, Agent, or Firm*—Michael J. Mehrman; Mehrman Law Office PC

(57) ABSTRACT

An electric power monitoring and response system using electromagnetic field sensors located remotely beside the phase conductors. The system determines unknown system variables for one or more three-phase power lines based on measured values obtained form the field sensors and, in some cases, known power system values. For a given physical configuration, the field sensors may include a magnetic or electric field sensors, and the known system values as well as the unknown system variables may include phase currents, phase voltages and distances defining the physical configuration of the system. The response equipment may be a display, a circuit interrupting device, a voltage regulator, a voltage sag supporter, a capacitor bank, communication equipment, and reporting system.

20 Claims, 9 Drawing Sheets

ELECTRIC POWER MONITORING AND RESPONSE SYSTEM

PRIORITY CLAIM TO RELATED APPLICATION

This application claims priority to commonly-owned U.S. Provisional Patent Application Ser. No. 60/583,907 entitled "Multiple Phase Current Sensor With Remote Multiple Sensors," filed on Jun. 29, 2004, which is incorporated herein by reference.

TECHNICAL FIELD

The present invention relates to the field of high voltage electric power transmission and distribution systems, and more particularly to an electric power monitoring and response system that uses remotely located electromagnetic field sensors to determine unknown power system variables, such as the phase currents, phase voltages and/or the distances from the field sensors to the phase conductors.

BACKGROUND OF THE INVENTION

At present, ring-type current transformers ("CTs") are the most prevalent technology for measuring phase currents in three-phase electric power transmission and distribution lines. While very accurate, these devices are quite expensive when applied at high voltages. This results, in large part, from the need to insulate the current sensors for high-voltage, which is quite expensive for voltages above 1,000 volts. There have been other approaches using other types of magnetic field sensors, such as a Hall Effect sensor, located close to each phase conductor. In multiphase applications, this technique is complicated by magnetic field interference from the adjacent phases, which results in inaccurate measurements. As a result, the only successful technique using this type technology has been to use a ring of magnetic field sensors that completely encircles the conductor to balance out the extraneous error signals from other phases. This approach also requires expensive high-voltage insulation for the magnetic field sensors, which makes the system economically feasible only at the highest transmission line voltages.

Another approach to high voltage current measurement uses fiber optic sensors that pass polarized light around each conductor. The magnetic field generated by the phase current rotates the polarization direction in proportion the current. While this technique reduces the difficulty of insulating the current sensor at high voltages, the sophisticated decoding technology required to turn the polarization measurement into a current measurement is quite expensive. Again, this approach is economically feasible only at the highest transmission line voltages.

Another type of power system unknown occurs because high currents and ambient air heat the electric conductors, which causes them to stretch and sag from their overhead supports. If this sag becomes too large, a voltage breakdown and resulting flash over can occur between the power line and another object, such as a tree or hill. It is therefore desirable to monitor the physical sag of the power line at critical locations during normal operating conditions. Algorithms have be used to estimate the physical sag of the power line based on the current values measured at the substation, ambient conditions, and the physical configuration of the line section of interest. But these algorithms only produce estimates of the physical sag at critical locations that can vary significantly from the actual conditions due to voltage drop and reactive power loading on the lined during high load conditions. Another approach has been to take direct distance measurement using optical systems that typically include laser distance finders and cameras. But these optical systems are very expensive, do not work well in the dark, can be adversely affected by bad weather and fouling by grime, bird droppings and the like.

Accordingly, there is an ongoing need for a cost effective electric power monitoring and response systems that avoid insulation problems and costly decoding systems. There is a further need for a electric power line sag monitoring system that does not rely on optical components.

SUMMARY OF THE INVENTION

The present invention meets the needs described above through an electric power monitoring and response system for a multi-phase power line that uses electromagnetic field sensors, such as inexpensive electric or magnetic field sensors, located remotely beside the phase conductors where they measure the electromagnetic fields generated by all of the phase conductors. The system then determines unknown system variables, such as phase currents, phase voltages or distances defining the phase conductor physical sag, based on the measured values obtained form the field sensors and, in some cases, one or more known system values. More specifically, for any given arrangement of phase conductors and sensors a set of simultaneous equations can be derived and effectively solved to determine the unknown system variables so long as the number of field sensors is at least a large as the number of unknown system variables. A solution can be reached by several different techniques including trial and error, algebraic solution and statistical methods. In addition, in many cases a linear equation for the unknown system variables based on a weighted sum of the sensor measurements can be derived in advance and used to determine the unknown system variables directly from the sensor measurements.

In other words, the invention solves the problem of inter-phase interference from multiple phase conductors by effectively solving the simultaneous equations necessary to determine the unknown system variables based on the measurements obtained from the field sensors. In some cases, the solution may use other known system values, such as distance values defining the distance from each field sensor to each phase conductor. One or more simplifying assumptions, such as balanced phase currents and equal physical sag, may also be used to reduce the number of field sensors. In addition, when the configuration of the power lines and the electromagnetic field sensors are known, the unknown system variables can be determined with a simple scaling and summing devices connected directly to the outputs of the sensors.

The resulting electric power monitoring and response system exhibits a number of important advantages over conventional systems. In particular, the field sensors are located "remotely beside" the phase conductors. In this description, the term "beside" means that each field sensor is located to one side, and thus does not surround, a phase conductor. It should be understood, however, that all of the field sensor need not be located to the same side of the phase conductors, but may be located anywhere in the electromagnetic field of the power line. The term "remotely" means that the sensors are located a significant distance from the phase conductors, preferably near the ground below the phase conductors. In practice, this allows inexpensive field sensors, such as Hall Effect magnetic field sensors, to be located sufficiently far away from the phase conductors to allow the ambient air to insulate the field sensors from the high-voltage power line. Unlike prior electric power monitoring techniques, this configuration is sufficient inexpensive to make the system economically feasible for wider range of power line voltages.

It should be appreciated that this type of electric power monitoring and response system using magnetic field sensors is not adversely affected by physical impediments such as weather, building, bridges, power line towers, substation equipment or other objects located in the magnetic fields because the magnetic field strength is not affected by these factors. This is a significant advantage, for example, when determining the values of the phase current in a power line located in a substation or in a multiple-line transmission line corridor where support structures, such as towers and substation equipment, are typically located within the magnetic field of the monitored power line.

It is often advantageous to locate the field sensors in positions where the distances from the sensors to the power lines does not change with system conditions. For example, the sensors can be located under the power line towers or in substations where the power lines are physically supported by overhead insulators. This allows the distances from the sensors to the power lines to be known values, which minimizes the number of sensors required to monitor the phase currents. Nevertheless, the system may also be employed to determine the physical sag experienced by a power line in a critical location by determining the distance of the phase conductors from the sensors measurements. This allows the power line physical sag to be monitored directly without relying on expensive optical equipment that can be adversely affected by weather and fouling by grime, bird droppings and the like.

In addition, the electric power monitoring and response system implements appropriate response actions based on the computed electric system variables. For example, a spike in the phase currents may indicate a system fault that requires the operation of one or more circuit interrupters to isolate the fault. Alternatively, persistent but not spiking high phase currents may indicate a high system load causing a voltage drop that can be alleviated by the operation of voltage support equipment, such as capacitor banks, voltage regulators or other voltage sag support equipment. Other response devices may also be activated, such as transmission line interconnection switches, strategically placed synchronous condensers, strategically placed diesel power generation stations, small hydroelectric power stations, battery and other power storage devices, fuel cells, load management, interruptable load and load shedding switches. These types of response actions are typically coordinated by a control center, where the system variables are recorded, analyzed and reported over time with reporting system. This type of system can determine, for example, whether current overload or power line physical conditions are getting worse or have reached a critical point.

This type of direct power system monitoring in critical locations improves the operation of the response equipment, avoids unnecessary and disruptive response actions in favor of more accurate and effective response actions, and generally results in the delivery of more reliable and higher quality power service. This type of system will also help to identify critical locations in which voltage support equipment is needed, as well as providing an very effective means for early detection and avoidance of cascading power outages, such at those affecting the Western, Midwestern and Northeastern United States in recent years. The system will also be an effective mechanism for identifying other types of potentially damaging power system disturbances, such as dynamic generation station oscillation, reactive power circulation, intermittent abnormal load behavior, lightening strikes, and so forth.

Generally described, the invention may be implemented as an electric power monitoring and response system for determining system variables associated with phase conductors of one or more multi-phase electric power line. The system includes a set of field sensors located remotely beside the phase conductors and positioned to simultaneously measure the combined electromagnetic fields generated by the phase conductors. In particular, the field sensors can be high-voltage insulated by ambient air by locating the sensors a sufficient distance away from the phase conductors to avoid a voltage breakdown between the phase conductors and the field sensors. The system also includes a controller configured to determine the system variables based on measurements received from the field sensors, and to produce output signals based on the system variables. The output signals are configured to cause response equipment to implement one or more response actions based on the output signals.

In various embodiments, The controller may also determine the system variables based on the field sensor measurements and known system values, typically distance values from the field sensors to the phase conductors. The field sensors may be magnetic field sensors or electric field sensors, the unknown system variables may be voltage, current or distance values, and the response equipment may be a display, a circuit interrupting device, a voltage regulator, a voltage sag supporter, a capacitor bank, communication equipment or reporting system. The response equipment may also include a local controller, a central controller and communication equipment for transmitting data between the local controller and the central controller. The analysis and reporting system typically maintains, analyzes and reports the system variables over time to determine, for example, whether current overload or power line physical conditions are getting worse or reaching a critical point.

In a particular embodiment, the field sensors are electric field sensors, the known system values are distance values, and the system variables are voltage values. Alternatively, the field sensors may be electric field sensors, the known system values may be voltage values, and the system variables may be distance values. In yet another embodiment, the field sensors are magnetic field sensors, the known system values are current values, and the system variables are distance values. Alternatively, the electric the field sensors may be magnetic field sensors, the known system values may be distance values, and the system variables may be current values. In addition, there may be no known values and, for example, both current and distance values may be determined from the measurements received from a sufficient number of magnetic field sensors. Furthermore, the system may determine system variables, such as current values, for more than one multi-phase power lines at the same time from the measurements received from a sufficient number of magnetic field sensors.

The invention may also be implemented as an electric power system including a number of power lines and associated electric power monitoring and response system, or as a method for determining system variables associated with phase conductors of one or more multi-phase electric power lines and responding to abnormal power system conditions determined from the system variables. The specific techniques and structures for implementing particular embodiments of the electric power monitoring and response system, and thereby accomplishing the advantages described above, will become apparent from the following detailed description of the embodiments and the appended drawings and claims.

DETAILED DESCRIPTION OF THE EMBODIMENTS

The present invention provides significant improvements in monitoring and fault protection equipment for multi-phase electric power lines. The specific embodiments use inexpensive magnetic field sensors, such as Hall Effect sensors, that are physically located beside (i.e., not surrounding) and removed from the phase conductors by a considerable distance. Preferably, the field sensors are located at or near the ground itself and at ground potential. This solves the high-voltage electrical insulation problem by using atmospheric air the insulating medium, which avoids special expensive insulation for the sensors. The measured magnetic field values received from the magnetic field sensors are combined with mathematical relationships and, in some cases.

To implement the system, a set of equations is derived for computing the values of a number of unknown system variables from an equal or greater number of measured sensor values. In general, the system variables may include phase currents, phase voltages and/or distances from the sensors to the phase conductors. Any of these values may be known in order to reduce the number of sensors required for a particular power monitoring application. For a multi-phase electric power system, for example, the measured values from three magnetic field sensors can be used to compute the phase currents provided that the distances from each magnetic field sensor to each phase conductor is known.

Similarly, the measured values from three electric field sensors can be used to compute the phase voltages provided that the distances from each magnetic field sensor to each phase conductor is known. Thus, the measured values from three magnetic field sensors and three electric field sensors can be used to compute the electric power flowing in each phase provided that the distances from each magnetic field sensor to each phase conductor is known. It should also be noted that distance values from each sensor to each phase conductor can also be determined as variables using the same techniques. For example, six magnetic field sensors can be used to compute the phase currents and the distance values for a multi-phase power line. Alternatively, six electric field sensors can be used to compute the phase voltages and the distance values for a multi-phase power line.

It should be appreciated that this electric power monitoring technique does not depend upon the physical configuration of any particular application because these factors only change the constants used in the corresponding equations. In addition, because the values produced by the sensors are theoretically linear, correction factors can be applied to compensate for variations as needed. In particular, correction factors can be readily determined for changes in the distance values based, for example, on conductor sag estimation.

For typical physical configurations shown in the specific examples described below, the distances are determined according to a rectangular geometry. But this type of configuration is not required since the mathematical principals only require that the number of measurements be at least as large as the number of unknowns. Other geometries could may also simplify the solutions but this does not change the principle of operation, which involves the use of inexpensive sensors and inexpensive calculation technology to render a very economical approach to determining the current flowing in each phase conductor on a continuous, real time basis. This results in a great economic benefit as compared to present conventional power monitoring technologies, which depend upon sensors surrounding and located near the phase conductors.

It should also be noted that the electromagnetic field sensors are preferably located a sufficient distance in air from the phase conductors to avoid the need for high-voltage insulation materials. In addition, the magnetic or electric field sensors may be sophisticated when a high degree of accuracy is required. And they may also be very simple and inexpensive when a lower degree of accuracy is acceptable. For example, the magnetic field sensor may be a coil or a Hall Effect sensor, and the electric field sensor may be a capacitor.

Similarly the controller can be any type of commonly available computer technology, and software can be simple or more sophisticated. For example, a sophisticated controller may use software and other types of fault detectors to accurately detect and filter out interference from unbalanced far field currents. Alternatively, the controller may be a simple algorithm that ignores this type of interference or applies a coarse correction factor. Of course, various levels of sophistication may be built into the system as needed. An important application of the technology will be for relatively low-voltage sub-transmission and distribution lines where conventional CT current monitoring technology is not economically feasible and, for this reason, not in place at this time. Inexpensive monitoring and response systems may also be deployed to more robustly monitor and control high-voltage power lines and associated response equipment in real time, which will produce important advantages as discussed previously.

Figure 1:
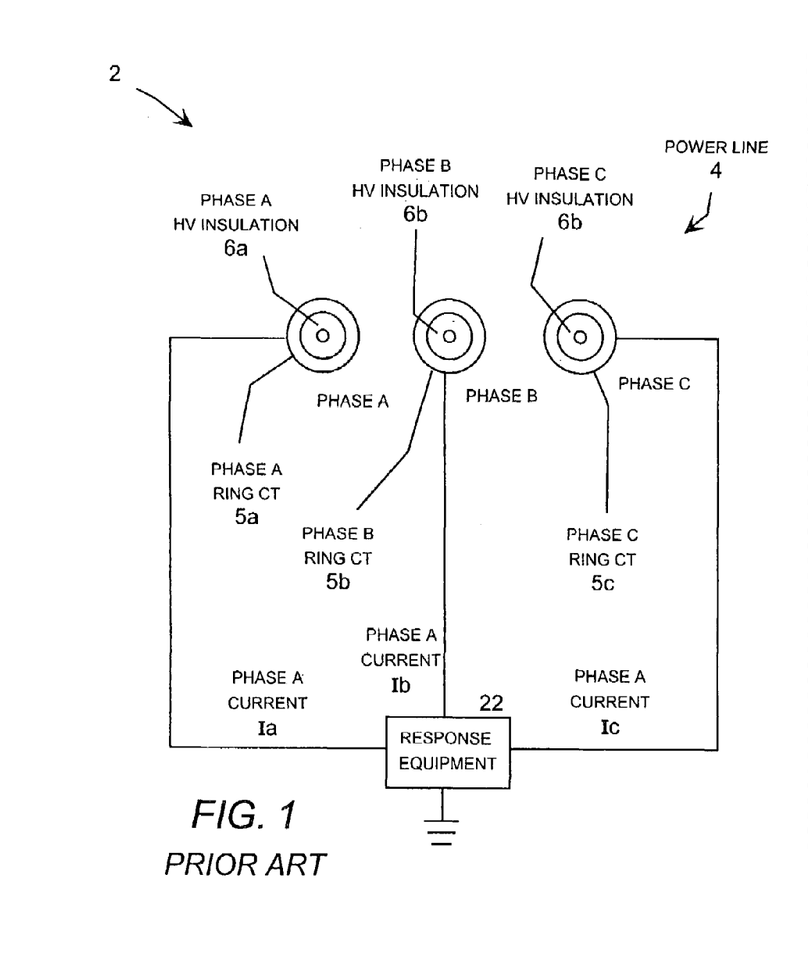
FIG. 1 is a conceptual illustration of a prior art electric power monitoring system including ring-type current sensors.

Referring now to the figures, in which like numerals refer to like elements throughout the several figures, FIG. 1 is a conceptual illustration of a prior art electric power monitoring system 2 for a power line 4 using conventional ring-type current sensors 5a–c, typically referred to as current transformers or CTs. The measurements produced by the CTs is typically used to activate some type of response equipment 22, such as a circuit interrupter, voltage regulator or other suitable device. In this type of system, inter-phase interference is eliminated by having the CT completely surround its associated phase conductor. This results in each CT only measuring the current in its associated phase conductor, as shown in FIG. 1. Although this is an effective way to eliminate inter-phase interference, it comes with the cost of having to insulate the CT for operation at high voltage. Specifically, the outer case of the CT is at ground potential, while the phase conductor is at line potential and located a very short distance away. This requires internal insulation 6a–c that is sufficient to prevent a voltage breakdown across the CT, which is sufficiently expensive to seriously limit the economic feasibility of this type of system.

Figure 2:
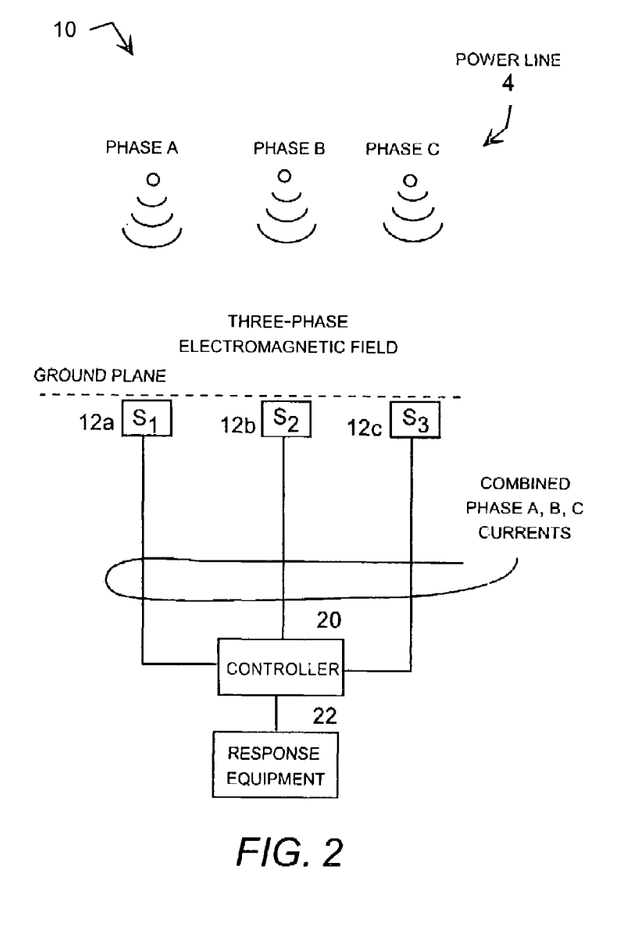
FIG. 2 is a conceptual illustration of a multiple phase electric power monitoring system including three field sensors located remotely beside three phase conductors.

FIG. 2 is a conceptual illustration of a much less expensive electric power monitoring system 10 for the three-phase power line 4. The system determines a number of system variables from electromagnetic field sensors and, in some cases, known system values. The system variables and system values may be phase currents, phase voltages or distance values from the sensors to the phase conductors. Any of these parameters may be system variables or known system values for various applications. In other words, in various applications the electric power monitoring system 10 may be used to determine the phase currents, the phase voltages and/or the power line physical sag, and any of these parameters may be known or unknown in a particular application. Magnetic field sensors are typically used to determine phase currents, electric field sensors are typically used to determine phase voltages, and the distance values may be known system values or system variables depending on the application. The distance values are known when the sensors are located where the distances do not change, for example in substations or under a power line adjacent to a tower where the phase conductors have overhead support. Alternatively, the distance values may be variables when the sensors are located under a free span of power line. This configuration is typically used to determine the physical sag of the power line in a critical location.

Figure 3:
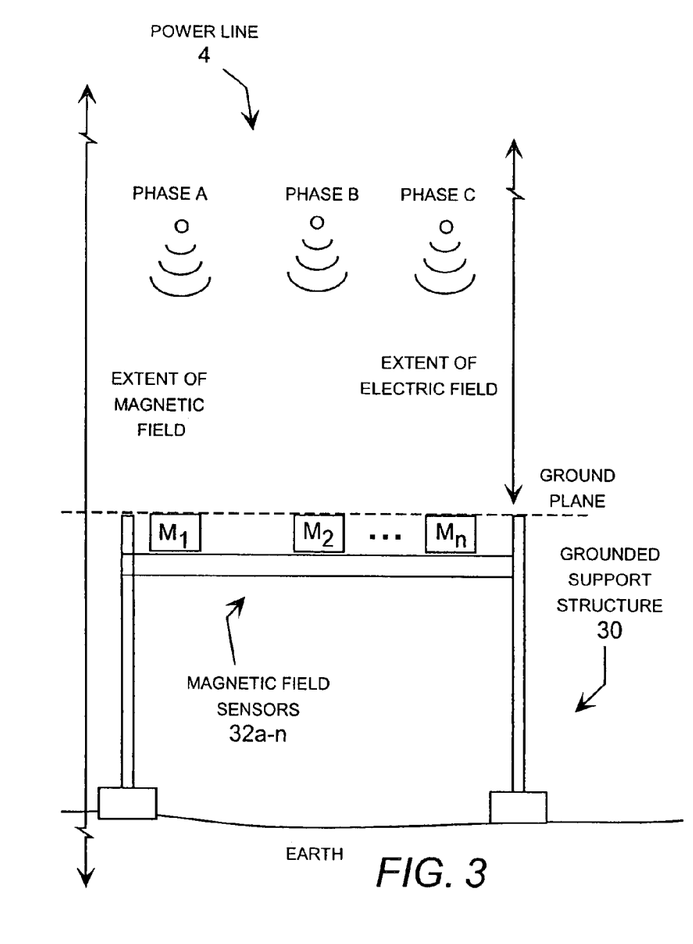
FIG. 3 is a conceptual illustration of a multiple phase electric power monitoring system including a number of magnetic field sensors located remotely beside three phase conductors.
Figure 4:
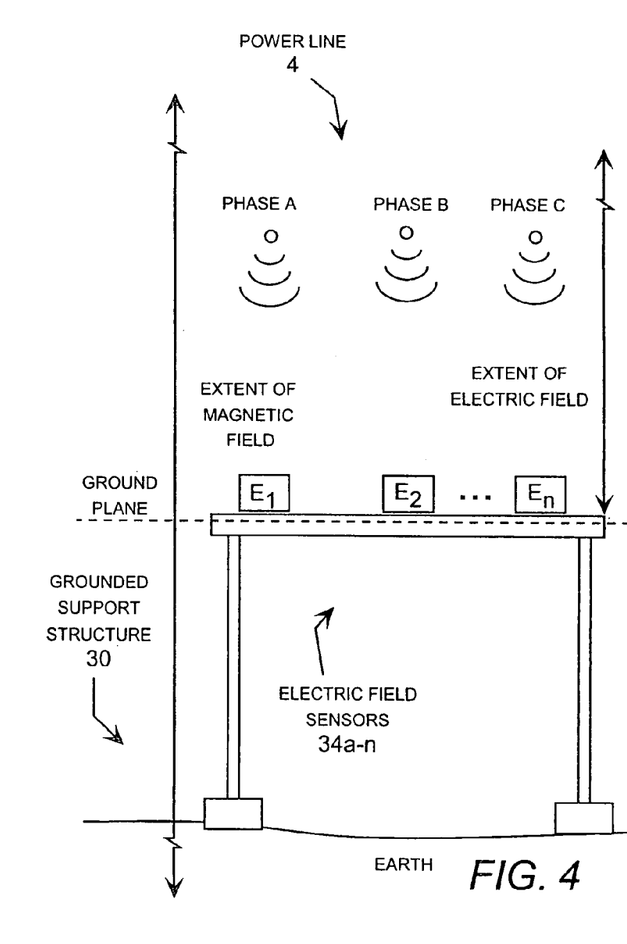
FIG. 4 is conceptual illustration of a multiple phase electric power monitoring system including a number of electric field sensors located remotely beside three phase conductors.
Figure 5:
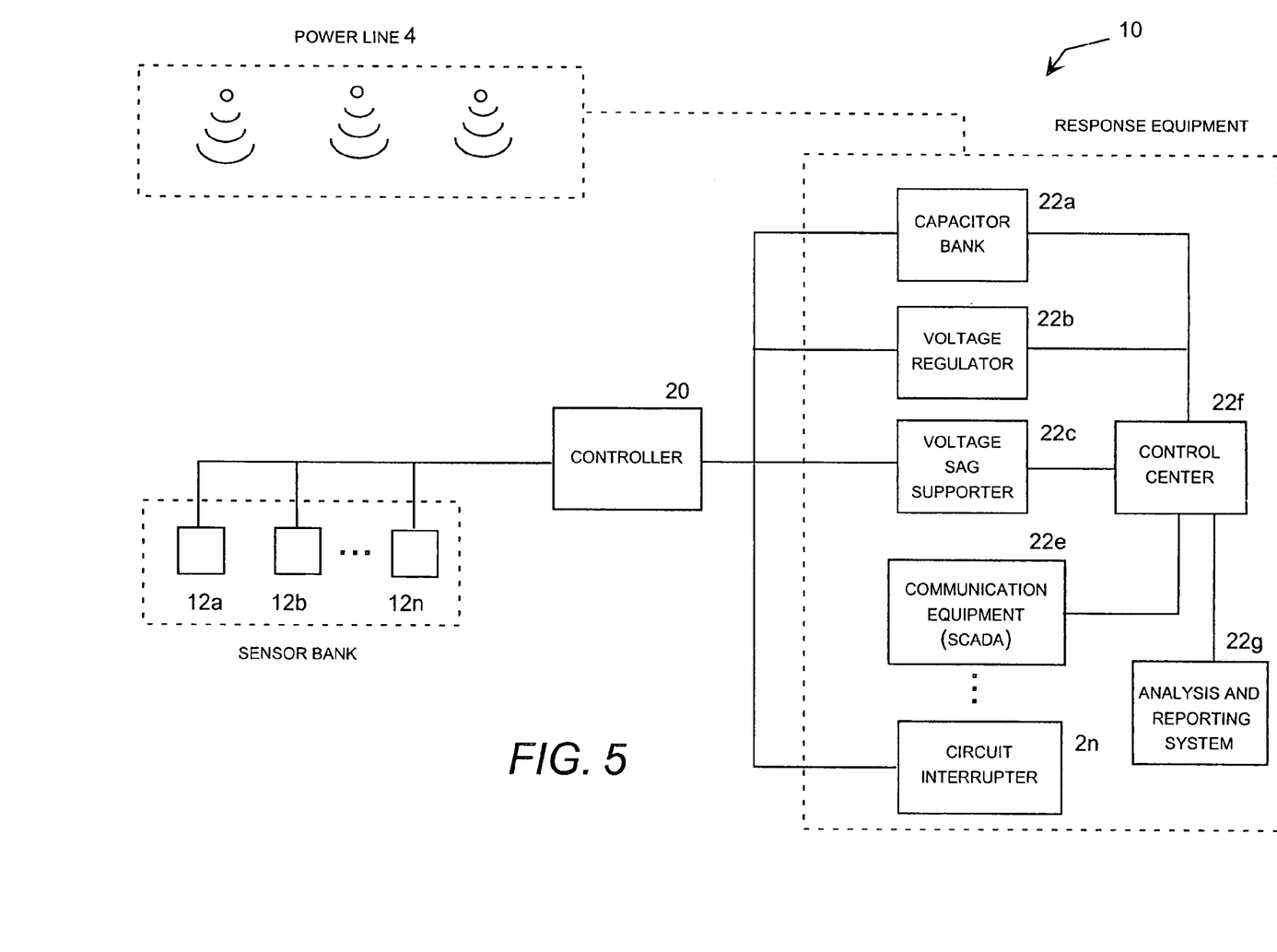
FIG. 5 is a block diagram showing electric power monitoring system with a number of response equipment alternatives.

The illustrative electric power monitoring system 10 shown in FIG. 2 includes three field sensors 12a–c located remotely beside three phase conductors, a controller 20, and response equipment 22. The sensors may be magnetic or electric field sensors, as shown in FIGS. 3 and 4, and typical response equipment is illustrated in FIG. 5. Because phase currents are often the most effective system variables to measure directly at strategic locations in a power system, and because magnetic fields produced by electric power lines are virtually impervious to structures located in the magnetic fields, configurations using magnetic field sensors to directly measure phase currents and physical sag can be expected to be predominant. Yet the underlying principles of the invention can be applied equally well using electric or magnetic field sensors, and for various levels of accuracy and sophistication.

By locating the sensors remotely beside the phase conductors, each sensors measures the combined currents from phases A–C. The sensors are also located a sufficient distance away from the phase conductors to allow ambient air to serve as the high voltage insulation. These are the main factors distinguishing the electric power monitoring system 10 shown in FIG. 2 from the conventional system shown in FIG. 1. These differences result in the important advantages discussed previously.

Figure 6:
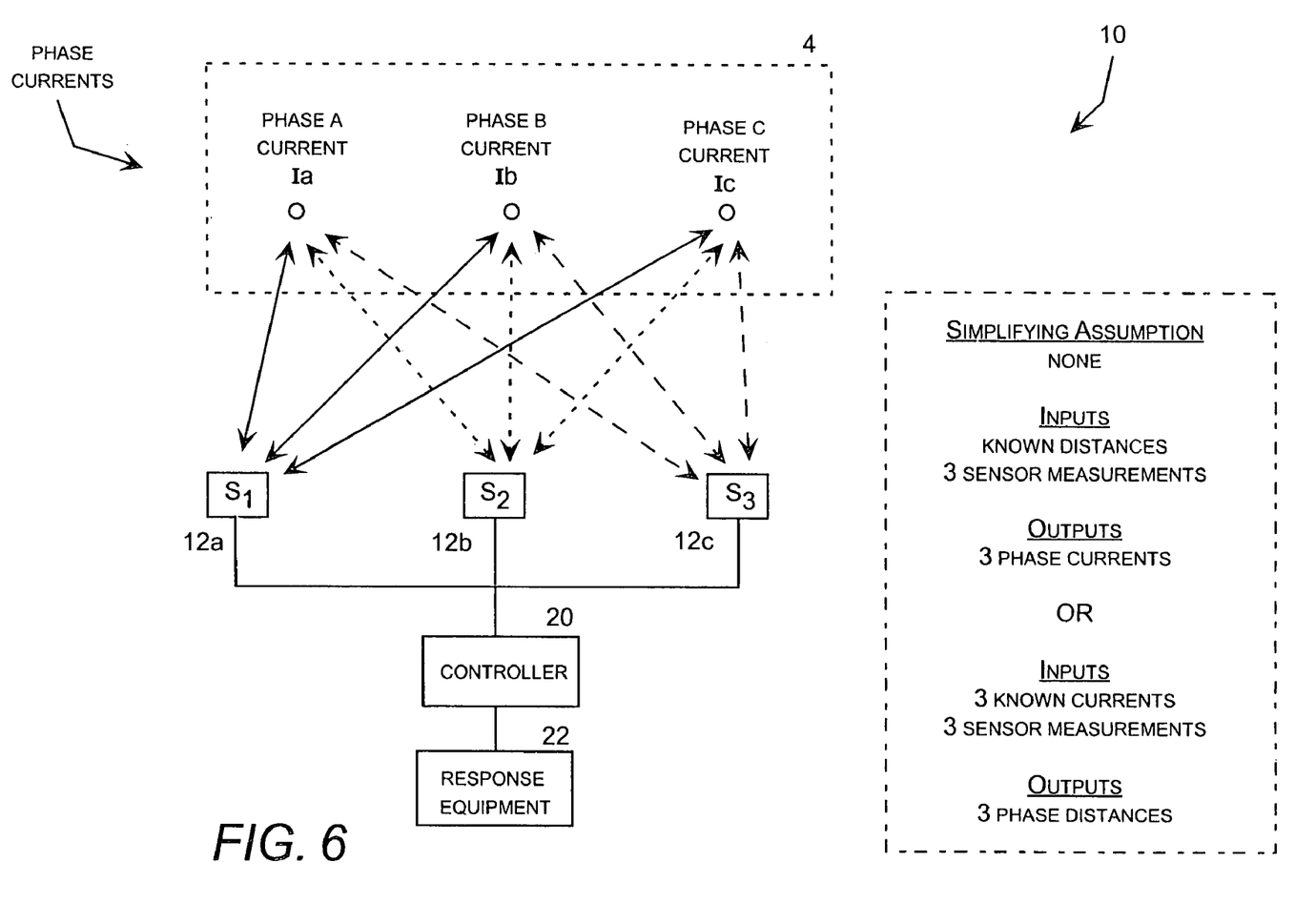
FIG. 6 is a block diagram showing an electric power monitoring and response system using three magnetic field sensors to determine three distance or three current values of a three-phase power line.
Figure 7:
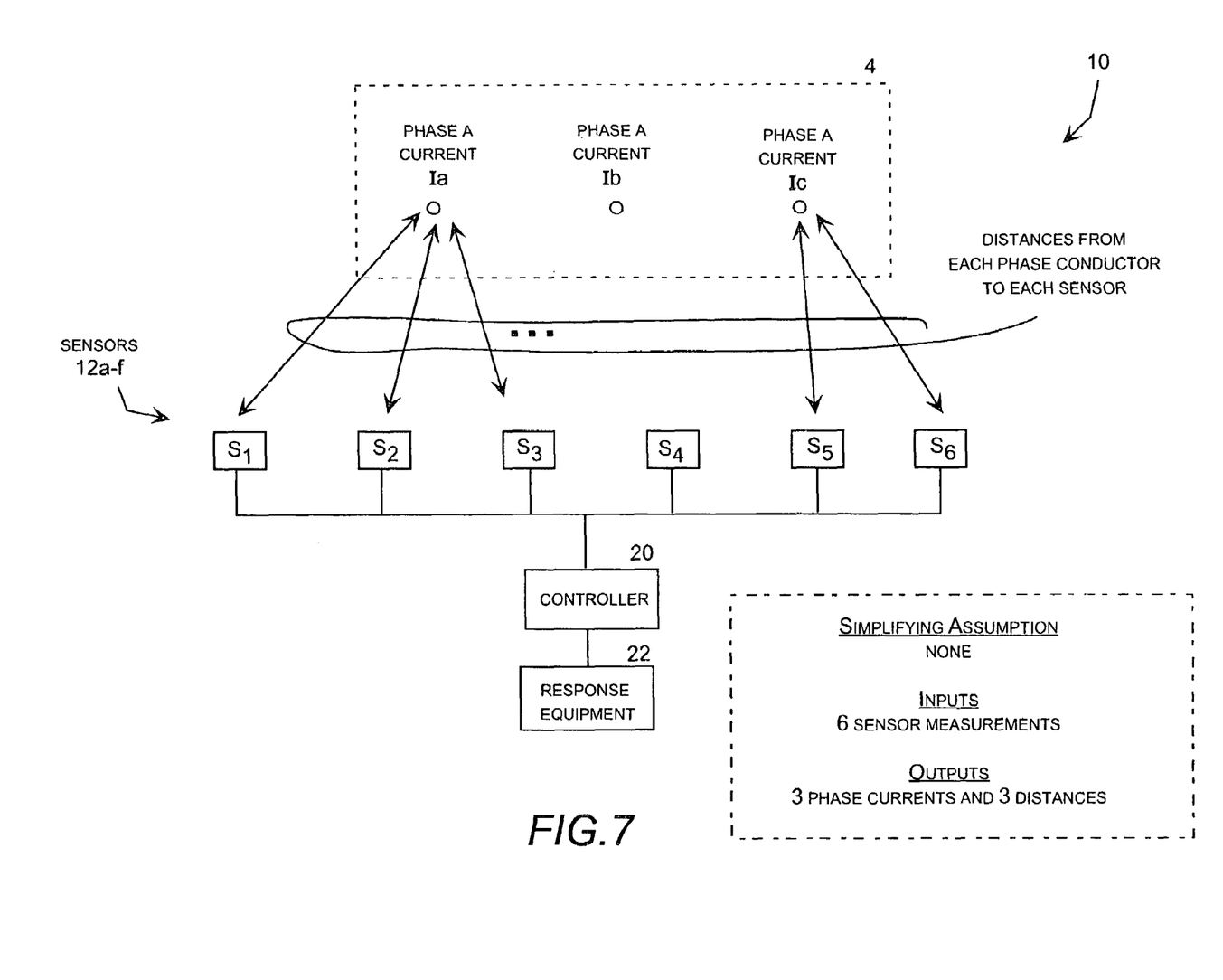
FIG. 7 is a block diagram showing an electric power monitoring and response system using six magnetic field sensors to determine three distance and three current values of a three-phase power line.

Because the phase sensors each measures the combined currents from phases A–C, the controller 20 is used to determine the current in each phase conductor from the measurements received from the sensors. In effect, a set of simultaneous equations is solved, either electronically or with software, to determine the phase currents from the sensor measurements. Theoretically, the simultaneous equations can be effectively solved provided that the number of unknown values, in this example the phase currents, is at least as large as the number of sensors 12a–c. FIGS. 6 and 7 illustrate two of the general cases, in which the number of sensors are equal to the number of unknown values.

Figure 8:
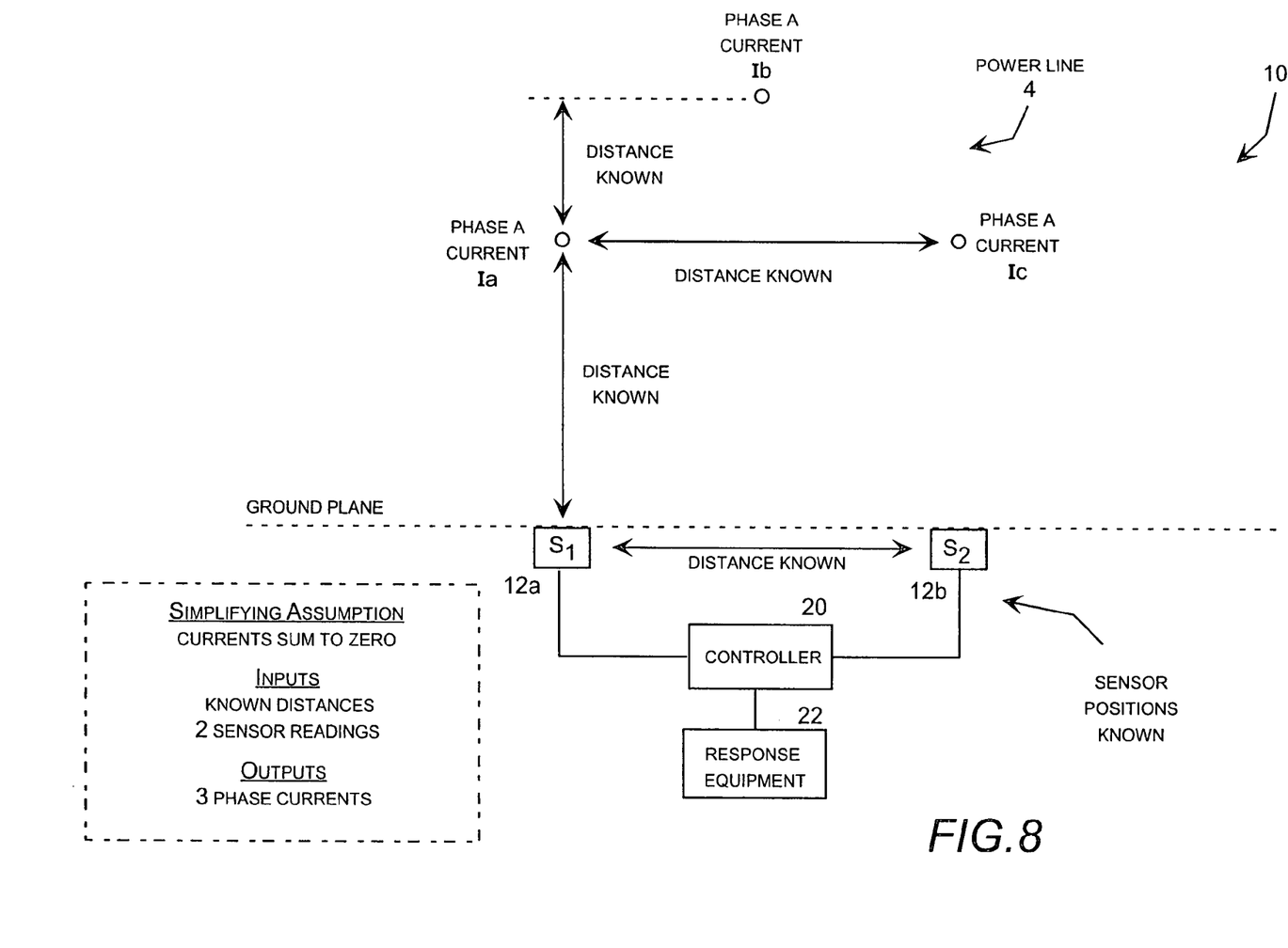
FIG. 8 is a block diagram showing an electric power monitoring and response system using two magnetic field sensors and a simplifying assumption to determine three current values of a three-phase power line.
Figure 9:
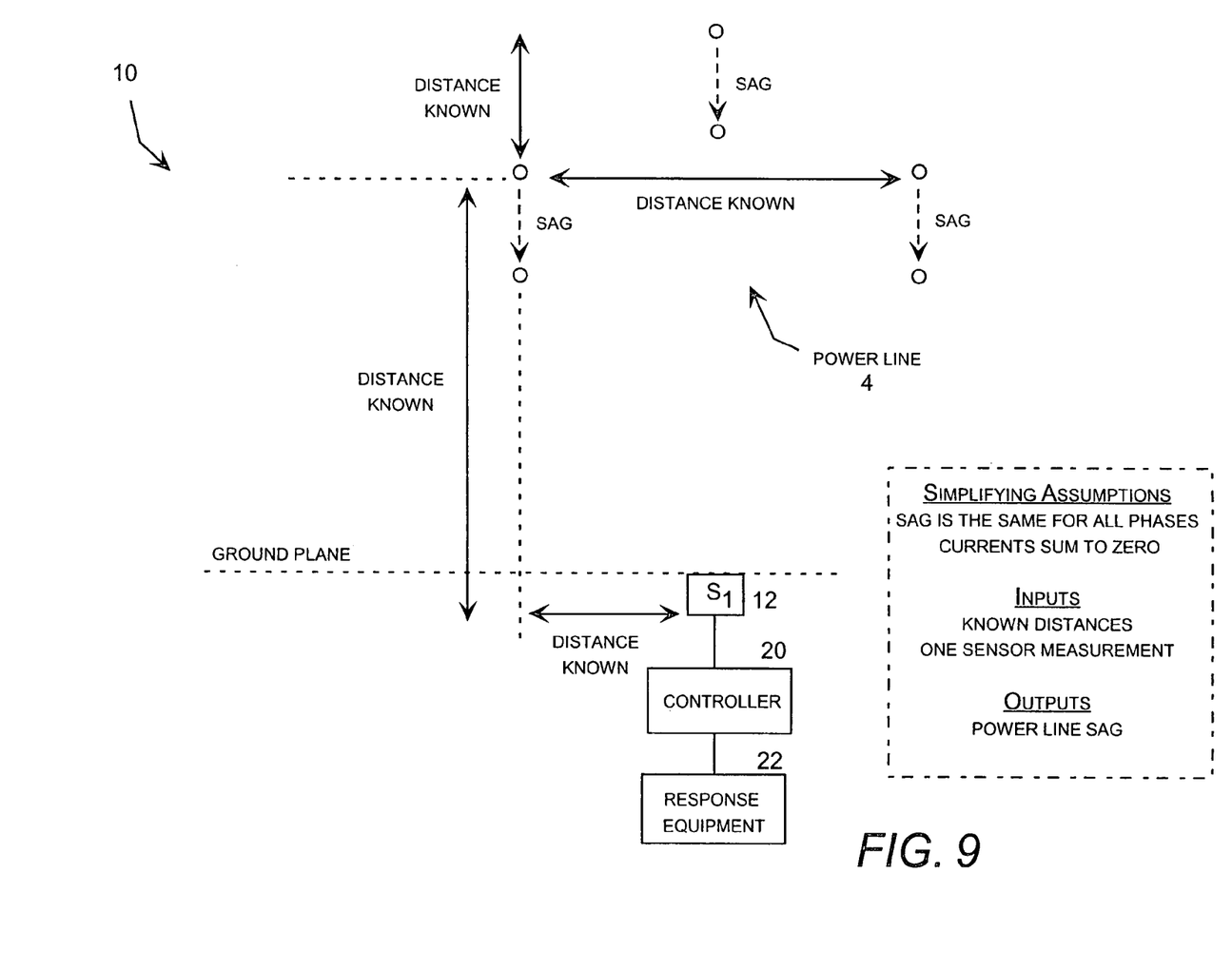
FIG. 9 is a block diagram showing an electric power monitoring and response system using one magnetic field sensor and two simplifying assumptions to determine the physical sag of a three-phase power line.
Figure 10:
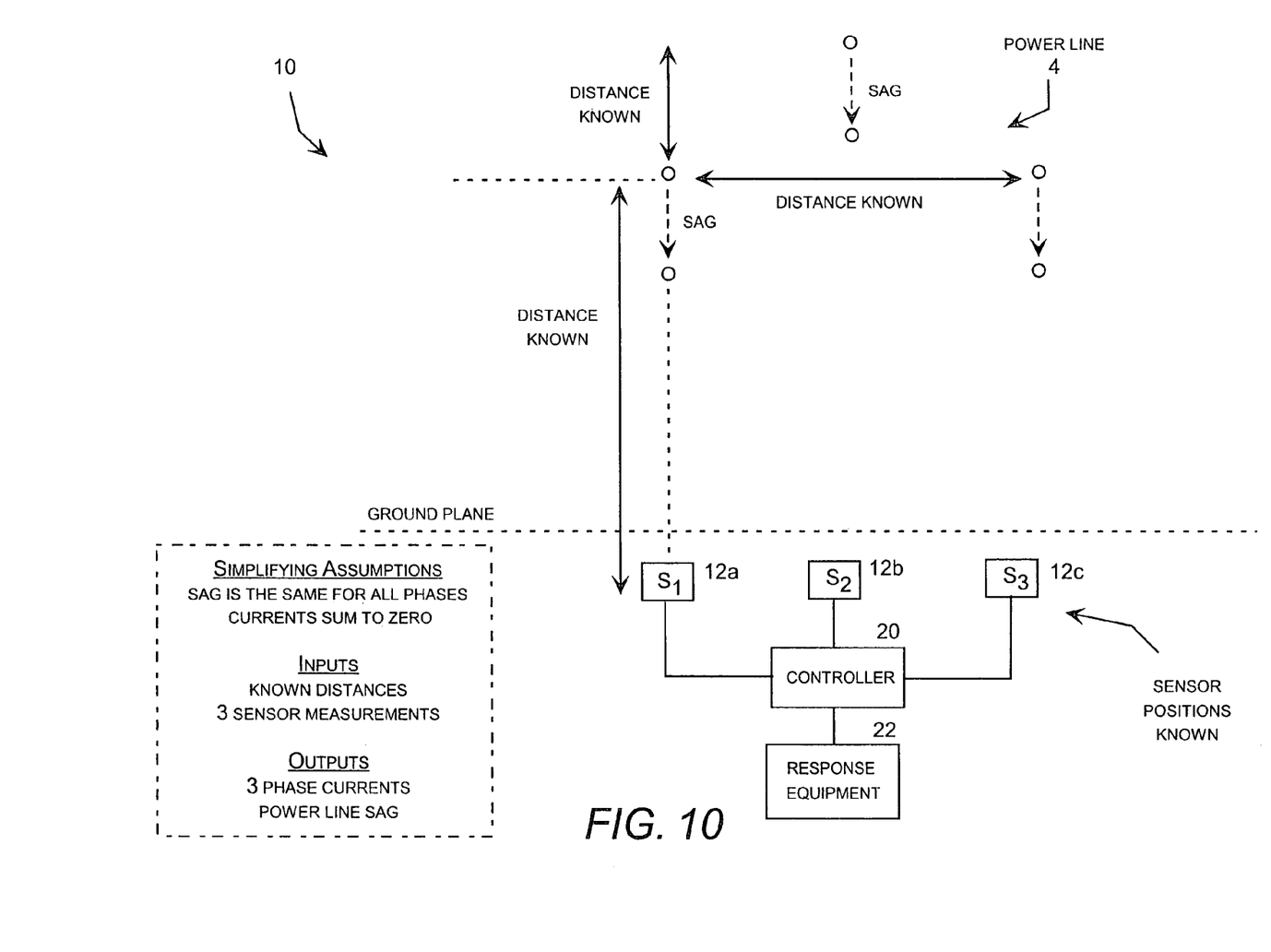
FIG. 10 is a block diagram showing an electric power monitoring and response system using three magnetic field sensor and two simplifying assumptions to determine the physical sag and three currents of a three-phase power line.
Figure 11:
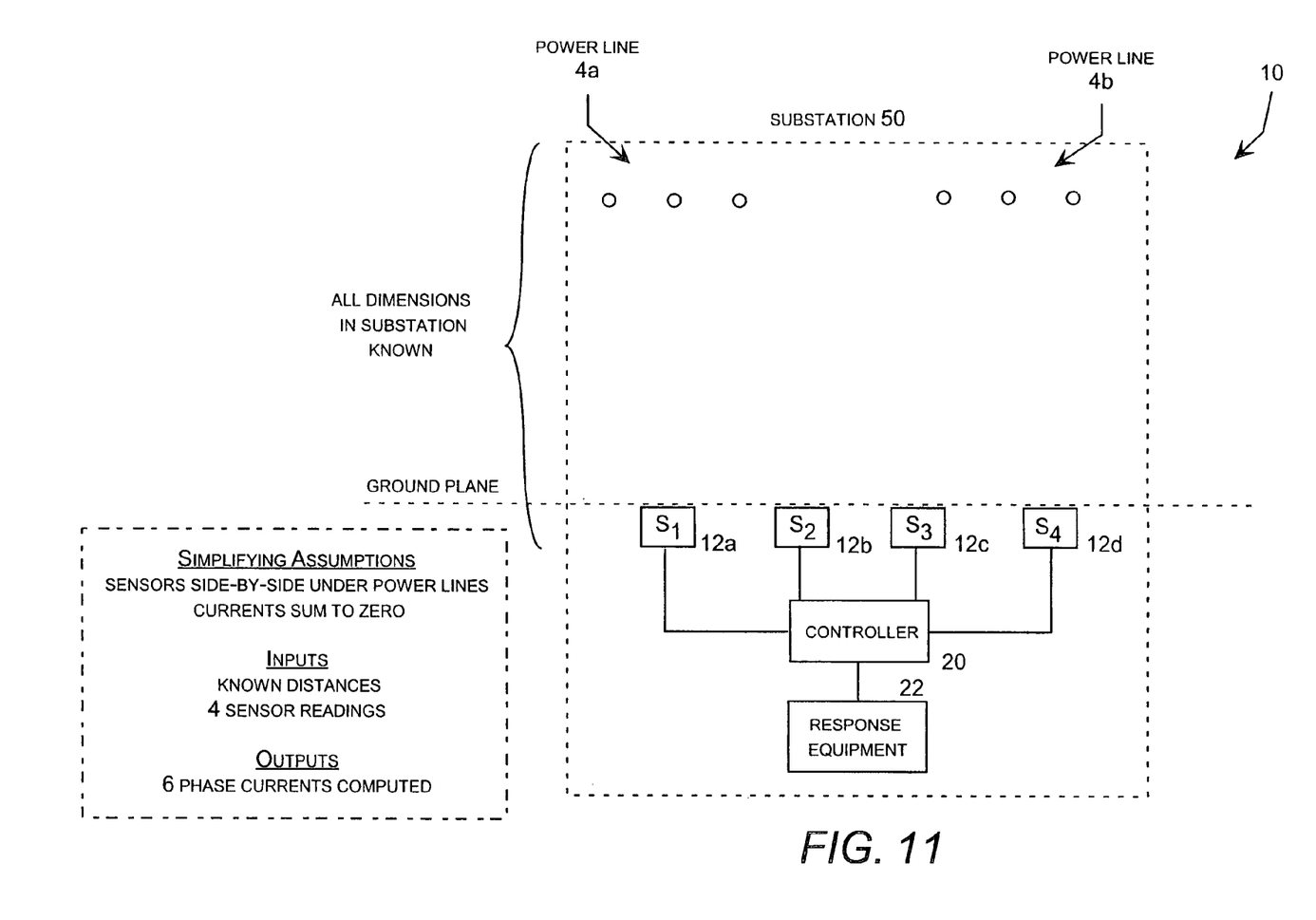
FIG. 11 is a block diagram showing an electric power monitoring and response system using four magnetic field sensors and two simplifying assumptions to determine six currents in two three-phase power lines.

In practice, however, certain known values and/or one or more simplifying assumptions are typically used to reduce the number of sensors required to determine the desired values. FIGS. 8 through 10 illustrate typical applications in which simplifying assumptions are used to reduce the number of field sensors required. In addition, FIG. 11 illustrates an application in which system variables are determined for two three-phase power lines at the same time. It should be understood that all of these examples are variations on the same theme, and that other configurations can be employed as needed for other specific applications.

It should also be appreciated that in applications in which the distances are known, the simultaneous equations for the phase currents reduce to weighted sums of the measurements from magnetic field sensors. Similarly, the simultaneous equations for the phase voltages reduce to weighted sums of the measurements from electric field sensors. For these applications, the weighting factors are constants that can be determined in advance based on the known distance values for the particular configuration. As a result, the controller 20 can be as a simple electronic circuit that applies constant weighting factors to the sensor outputs and sums the result to determine each system variable. Alternatively, an inexpensive computing device implemented on an inexpensive chip can be configured to determine the system variables. Once the basic principles of the inventions are understood, specific applications can be developed as needed.

FIG. 3 is a conceptual illustration of a multiple phase electric power monitoring system including a number of magnetic field sensors 32a–n are located remotely beside three phase conductors of a power line 4. The magnetic field sensors are located on a grounded support structure 30. The upper most grounded structure below the power line, in this case the grounded support structure. The ground plane eliminates the electric field below the uppermost extent of the grounded support structure but only has a minimal effect on the magnetic field. The power line is designed such that the ground plane is located a safe distance away from the point at which a voltage breakdown could occur between the power line and the upper most grounded structure, yet well within the area in which the electromagnetic fields can be measured. As a result, the magnetic field sensors are typically located under the power line just under the ground plane where they measure the phase currents from the magnetic field strength, as shown in FIG. 3. Electric field sensors are located just above the ground plane where they measure the phase voltages from the electric field strength.

FIG. 5 is a block diagram the showing electric power monitoring system 10 with a number of alternatives for the response equipment 22. In general, the response equipment may include any suitable type of display, computing device, communication equipment or other electric device that can be activated by a relay. Typical examples include remotely or locally devices that compensate for a persistent high current or a voltage sag condition, such as a capacitor 22a, a voltage regulator 22b or a voltage sag supporter 22c. In another important application, the response equipment may include a local or remotely located circuit interrupter 2n, such as a circuit breaker or similar device that responds to a detected power line fault.

The response equipment may also include communication equipment, such as supervisory control and data acquisition (SCADA) equipment commonly used in the electric power industry. SCADA equipment transmits the output data from the controller 20 to a central control center 22f that, in turn, controls the response equipment. Typical examples include transmission line interconnection switches, strategically placed synchronous condensers, strategically placed diesel power generation stations, small hydroelectric power stations, battery and other power storage devices, fuel cells, load management, interruptable load and load shedding switches.

In addition, the response equipment may include a analysis an reporting system 22g that is typically located or in communication with the control center 22f. This system typically stores and analyses the power system values over time including phase currents, phase voltages and physical power line sag conditions to detect recurring and worsening problems. This allows the system engineers to plan for and install long and short range system upgrades. Because the electric power monitoring system 10 is inexpensive and easy to operate, it can be installed in strategic locations throughout the electric power system.

Once power system values are continually monitored, recorded and analyzed using this type of system, a comprehensive strategic response system can be implemented based on real time power system values. This capability will help meet important operating objectives, such as avoiding unnecessary and disruptive response actions in favor of more accurate and effective response actions, and generally results in the delivery of more reliable and higher quality power service. This type of system will also help with short and long range planning based on real system data. This capability will be exceedingly valuable as a cost effective way to meet very important electric power system objectives, such as identifying critical locations where voltage support equipment is needed, and providing a very effective means for early detection and avoidance of cascading power outages, such as those affecting the Western, Midwestern and Northeastern United States in recent years. The system will also be an effective mechanism for identifying other types of potentially damaging power system disturbances, such as dynamic generation station oscillation, reactive power circulation, intermittent abnormal load behavior, lightening strikes, and so forth.

FIG. 6 is a block diagram showing an electric power monitoring and response system using three magnetic field sensors 12a–c to determine three distance or three current values of a three-phase power line. That is, this FIG. 6 illustrates the general case for a three-phase power line, in which the number of sensors is equal to the number of unknown system variables. In this example, the controller 20 may determine and output three phase current values based on three magnetic field measurement and known phase distance values. Alternatively, the controller 20 may determine and output three phase distance values based on three magnetic field measurement and known phase current values.

FIG. 7 is a block diagram showing an electric power monitoring and response system using six magnetic field sensors 12a through 12f to determine three distance and three current values of a three-phase power line. Again, this is the general case in which the number of sensors is equal to the number of unknown system variables. This type of configuration may be used, for example, to determine the phase currents current and physical sag under a free span of a power line at a strategic location.

As noted previously, there are simplifying assumption that can be made to reduce the number of field sensors required for a particular application. In particular, it may be assumed that the phase currents are balanced, in which case they sum to zero. Thus, the third phase current can be determined from measurements of the other two phase currents. This configuration is shown in FIG. 8, where the physical sag of each conductor of a three-phase power line is determined with two magnetic field sensors 12a and 12b. Moreover, as shown in FIG. 9, the physical sag can be determined from a single magnetic field sensor 12 using a second simplifying assumption, in this case that the physical sag of each phase conductor is the same. Of course, a typical electric power line will experience virtually balanced phase currents and virtually equal physical sag under normal operating condition. These values will only vary significantly during fault conditions, when the main objective is to identify and respond to the fault rather than measure the phase current with a high degree of accuracy. For these reasons, a single sensor system as shown in FIG. 9 could be used to determine the physical sag of a power line in applications where that parameter is the only system variable desired.

FIG. 10 shows an example in which the same simplifying assumptions (i.e., balanced phase currents and equal physical sag) and three magnetic field sensor are used to determine the physical sag and three currents of a three-phase power line. This configuration will be preferred for many applications because the phase currents and the physical sag are the system variables typically desired at strategic locations along power lines. FIG. 11 illustrates an application suitable for a substation, where four magnetic field sensors are located beneath two three-phase power lines. In this case, assuming that the currents are balanced in both power lines (i.e., two simplifying assumptions) four sensors 12a trough 12d are used to determine six currents in two three-phase power lines.

It should be understood that the foregoing relates only to the exemplary embodiments of the present invention, and that numerous changes may be made therein without departing from the spirit and scope of the invention as defined by the following claims.

The invention claimed is:

1. An electric power monitoring and response system for determining a power line physical sag condition associated with phase conductors of a multi-phase electric power line, comprising:
   at least one field sensor located below the phase conductors and positioned to obtain a measurement comprising a representation of the combined electromagnetic fields generated by the phase conductors;
   a controller configured to determine the power line physical sag condition based on the measurement received from the field sensor and to generate output signals based on the power line physical sag condition, wherein the controller comprises a local controller proximate to the field sensor, a central controller, and communication equipment for transmitting data associated with the measurement or the power line physical sag condition between the local controller and the central controller; and
   response equipment responsive to the output signals operative to display information associated with the power line physical sag condition, report information associated with the power line physical sag condition, or electrically compensate for a persistent high, current or a voltage sag condition indicated by the power line physical sag condition.

2. The electric power monitoring and response system of claim 1, wherein the response equipment comprises equipment operative to electrically compensate for a persistent high current or a voltage sag condition indicated by the power line physical sag condition.

3. The electric power monitoring and response system of claim 2, wherein the response equipment is selected from the group consisting of a circuit interrupting device, a voltage regulator, a voltage sag supporter, and a capacitor bank.

4. An electric power monitoring and response system for determining a power line physical sag condition associated with phase conductors of a multi-phase electric power line, comprising:
   a set of field sensors located below the phase conductors, each positioned to obtain a measurement comprising a representation of the combined electromagnetic fields generated by the phase conductors, wherein the number of field sensors is fewer than the number of phase conductors;
   a controller configured to determine the power line physical sag condition based on the measurements received from the field sensor and to generate output signals based on the power line physical sag condition, wherein the controller comprises a local controller proximate to the field sensor, a central controller, and communication equipment for transmitting data associated with the measurement or the power line physical sag condition between the local controller and the central controller; and
   response equipment responsive to the output signals operative to display information associated with the power line physical sag condition, report information associated with the power line physical sag condition, or electrically compensate for a persistent high current or a voltage sag condition indicated by the power line physical sag condition.

5. The electric power monitoring and response system of claim 4, wherein the response equipment comprises equipment operative to electrically compensate for a persistent high current or a voltage sag condition indicated by the power line physical sag condition.

6. The electric power monitoring and response system of claim 5, wherein the response equipment is selected from the group consisting of a circuit interrupting device, a voltage regulator, a voltage sag supporter, and a capacitor bank.

7. An electric power monitoring and response system for determining system variables associated with phase conductors of a multi-phase electric power line, comprising:
   one or more field sensors located remotely beside the phase conductors and positioned to simultaneously measure the combined electromagnetic fields generated by the phase conductors;
   a controller configured to determine the system variables based on measurements received from the field sensors and to produce output signals based on the system variables;
   wherein the controller comprises a local controller proximate to the field sensors, a central controller, and communication equipment for transmitting data associated with the measurements or the system variables between the local controller and the central controller; and
   response equipment responsive to the output signals operative to display information associated with the system variables, report information associated with the system variables, or electrically compensate for a persistent high current or a voltage sag condition indicated by the system variables.

8. The electric power monitoring and response system of claim 7, wherein the response equipment comprises equipment operative to electrically compensate for a persistent high current or a voltage sag condition indicated by the system variables.

9. The electric power monitoring and response system of claim 8, wherein the response equipment is selected from the group consisting of a circuit interrupting device, a voltage regulator, a voltage sag supporter, and a capacitor bank.

10. The electric power monitoring and response system of claim 7, wherein the field sensors are located to a common side of the phase conductors.

11. The electric power monitoring and response system of claim 7, wherein the field sensors are located below the phase conductors.

12. The electric power monitoring and response system of claim 7, wherein the response equipment comprises a display for indicating values representing the system values.

13. The electric power monitoring and response system of claim 7, wherein the field sensors include magnetic field sensors.

14. The electric power monitoring and response system of claim 7, wherein the field sensors include electric field sensors.

15. The electric power monitoring and response system of claim 7, wherein the controller is further configured to determine the system variables based on the field sensor measurements and known system values.

16. The electric power monitoring and response system of claim 15, wherein the field sensors include electric field sensors, the known system values include distance values, and the system variables include voltage values.

17. The electric power monitoring and response system of claim 15, wherein the field sensors include electric field sensors, the known system values include voltage values, and the system variables include distance values.

18. The electric power monitoring and response system of claim 15, wherein the field sensors include magnetic field sensors, the known system values include current values, and the system variables include distance values.

19. The electric power monitoring and response system of claim 15, wherein the field sensors include magnetic field sensors, the known system values include distance values, and the system variables include current values.

20. The electric power monitoring and response system of claim 7, wherein the field sensors are high-voltage insulated by ambient air because the sensors are located a sufficient distance away from the phase conductors to avoid a voltage breakdown between the phase conductors and the field sensors.

* * * * *